United States Patent
Li (10) Patent No.: US 6,753,777 B2
(45) Date of Patent: Jun. 22, 2004

(54) DETECTING DEVICE APPLIED TO A VEHICLE DOOR

(76) Inventor: Shih-Hsiung Li, 7F-5, No. 23, Sec. 1, Hangchow S. Rd., Taipei (TW)

( * ) Notice: Subject to any disclaimer, the term of this patent is extended or adjusted under 35 U.S.C. 154(b) by 0 days.

(21) Appl. No.: 10/293,284

(22) Filed: Nov. 14, 2002

(65) Prior Publication Data

US 2004/0095240 A1 May 20, 2004

(51) Int. Cl.[7] .............................................. G08B 13/18
(52) U.S. Cl. .................... 340/552; 340/557; 296/146.1; 49/26
(58) Field of Search ................................ 340/556, 557, 340/545.3, 686.6, 573.1, 551, 565, 540, 545.1, 552; 250/221, 222.1; 296/146.1, 146.4; 49/26; 701/49

(56) References Cited

U.S. PATENT DOCUMENTS

| | | | |
|---|---|---|---|
| 4,853,531 A | * | 8/1989 | Rejc ............................ 250/221 |
| 5,074,073 A | * | 12/1991 | Zwebner ........................ 49/26 |
| 5,424,717 A | * | 6/1995 | Platt et al. ................... 340/557 |
| 6,271,512 B1 | * | 8/2001 | Lewis .......................... 250/221 |
| 6,339,305 B1 | * | 1/2002 | Ishihara et al. ............. 318/445 |
| 6,362,735 B2 | * | 3/2002 | Sicuranza ................... 340/556 |

* cited by examiner

Primary Examiner—Anh V. La
(74) Attorney, Agent, or Firm—Fei-Fei Chao; Venable LLP (57) ABSTRACT

A detecting device applied to a vehicle door has a signal transceiver placed above the vehicle door to monitor by downward signals if any passenger or obstacle is near the door. A control circuit is connected to and controls the signal transceiver to emit detecting signals when the vehicle door is opened. Based on the reflected signals, the detecting device judges if any passenger is near the door, and controls the closing/opening movements of the door to avoid any possible injury to passenger.

19 Claims, 8 Drawing Sheets

DETECTING DEVICE APPLIED TO A VEHICLE DOOR

BACKGROUND OF THE INVENTION

1. Field of the Invention

The present invention relates to a detecting device, and more particularly to a detecting device that is mounted on the top of a vehicle door to monitor if any passenger or obstacle is near the door, and controls the closing/opening movements of the door based on the detected result.

2. Description of Related Arts

Because of the popularity of public transportation, such as buses, trains or rapid transit systems (RTS), safety of passengers accordingly becomes an essential consideration for the public.

One kind of accident experienced by public transport users is caused from the closing of doors at the wrong time. Taking the public bus as an example where the door is automatically controlled by the driver, the driver may be distracted or have restricted viewing of the door due to overcrowding. A passenger attempting to get on or off the bus may become trapped in the closing door while still outside the bus, and then be dragged along. Clearly passengers are in danger of receiving serious injury and the bus company will become liable to very costly lawsuits. To overcome the problems, a detecting device applied to the vehicle door to monitor whether any passenger or obstacle is near the door in accordance with the present invention is disclosed to obviate or mitigate the aforementioned problems.

SUMMARY OF THE INVENTION

The main objective of the present invention is to provide a detecting device that is placed above a vehicle door to monitor by downward emitting signals if any passenger or obstacle is near the door. Based on the detected result, the detecting device controls the movement of the closing/opening movements of the door to avoid any possible injury to passengers.

To achieve the objective, the detecting device provides a signal transceiver that is placed above the vehicle door to emit/receive detecting signals, and the signal transceiver is further connected to a control circuit, wherein the control circuit comprises:

- a central processor controlling a signal emitting/receiving unit to output/receive detecting signals via the signal transceiver;
- a door monitoring unit connected to the central processor, and actuating the central processor when the door is opened;
- a door control unit responded to the central processor to open/close the door;
- a power supply unit providing operating voltage to the central processor, the door monitoring unit and the door control unit;
- wherein after the door is opened, the central processor is actuated by the door monitoring unit and controls the signal emitting/receiving unit to output detecting signals via the signal transceiver, and then based on the reflected signals, closes the door.

Said signal emitting/receiving unit is an infrared emitting/receiving unit or an ultrasonic emitting/receiving unit.

Said door monitoring unit is composed of a switch, such as a magnetic reed switch, wherein after the door is opened, the switch is changed to the open status from the closed status.

Said door control unit is composed of a relay.

The features and structure of the present invention will be more clearly understood when taken in conjunction with the accompanying figures.

DETAILED DESCRIPTION OF THE PREFERRED EMBODIMENT

Figure 1:
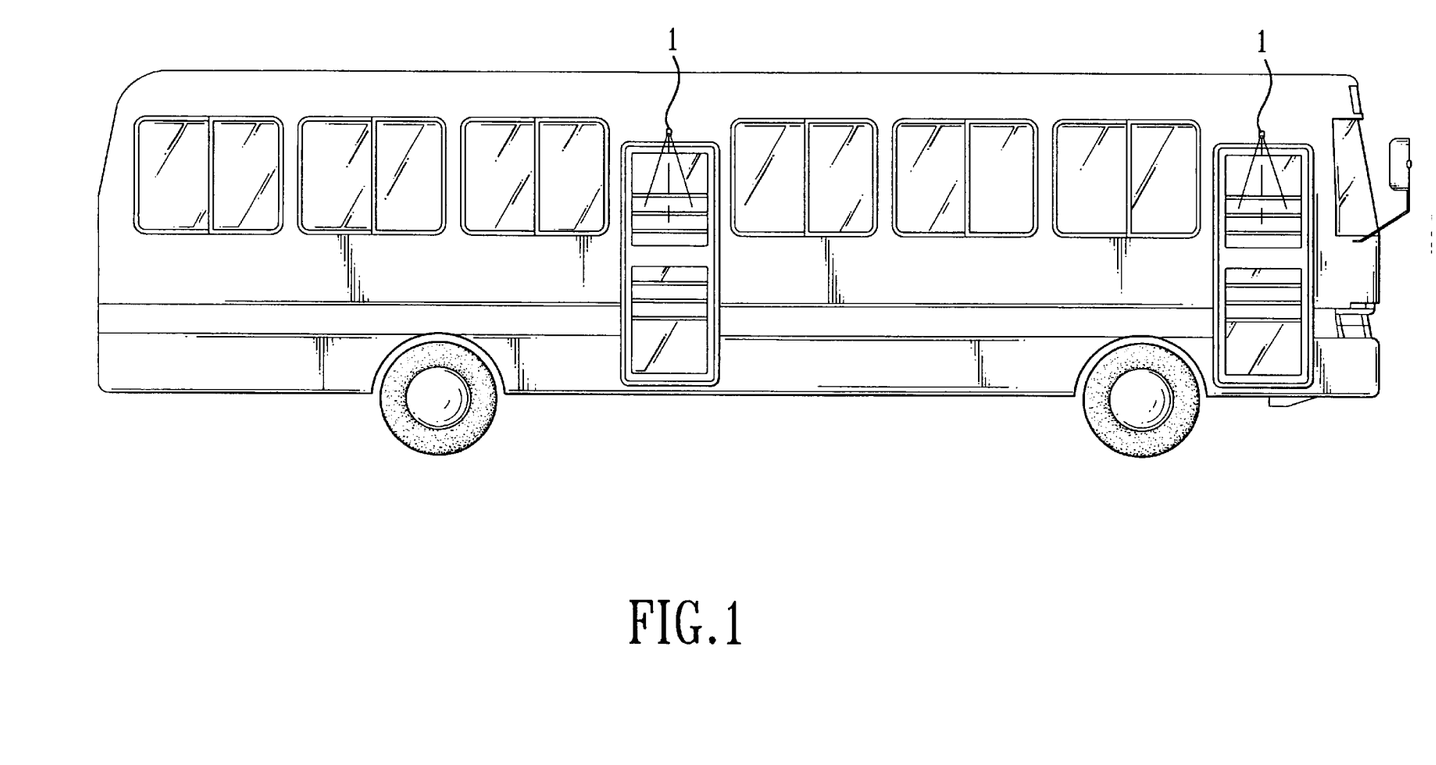
FIG. 1, is an operational schematic view showing a detecting device in accordance with the present invention is placed above a door.

With reference to FIG. 1, a detecting device in accordance with the present invention is applied to monitor a vehicle door. The detecting device applies a signal transceiver (1), which is controlled by a circuit (not shown in FIG. 1), placed above the door to downward emit detecting signals for checking if any passenger or subject is near the door. Based on the reflected signals, the control circuit determines whether the door is able to close safely.

Figure 2:
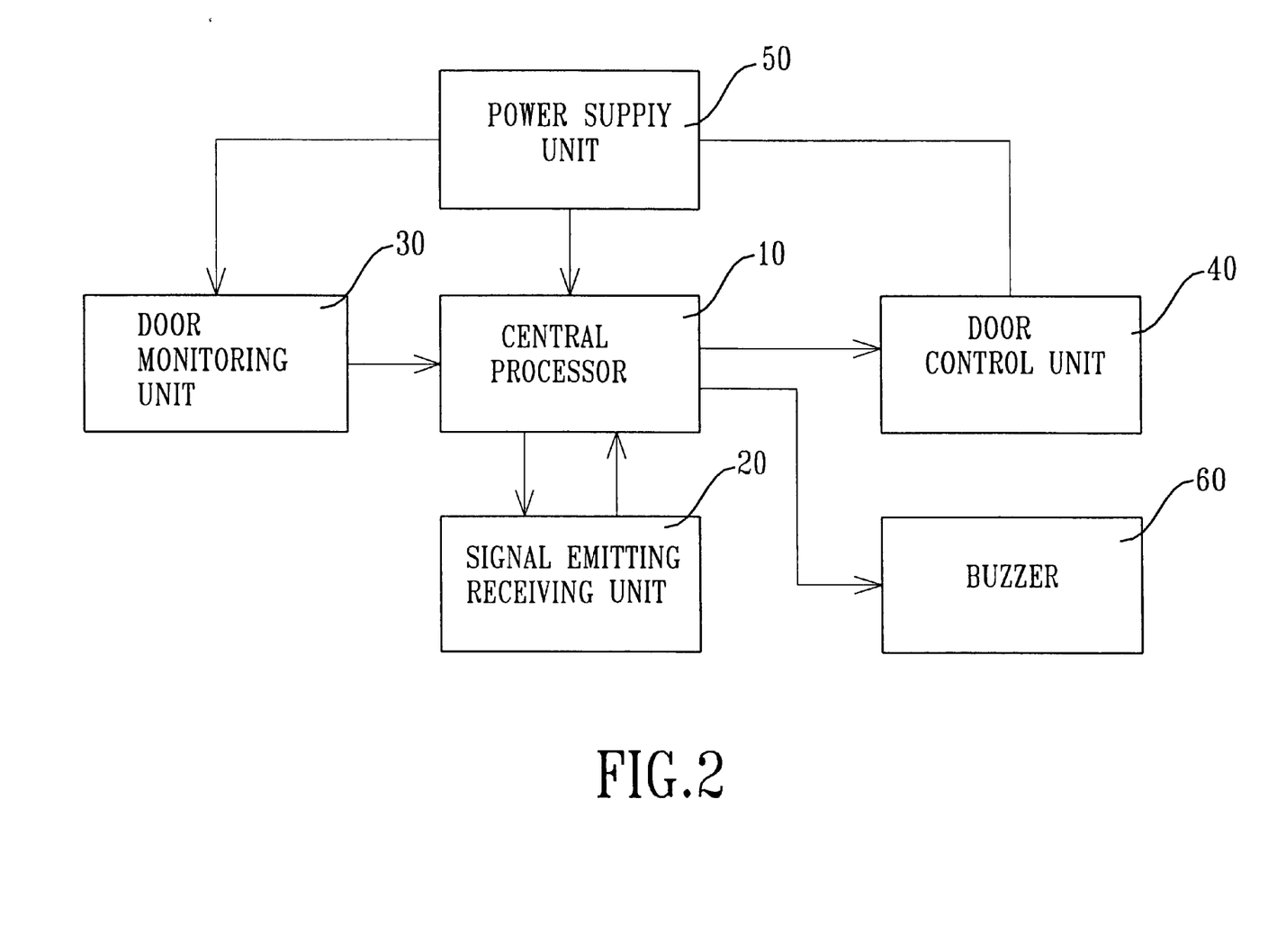
FIG. 2 is a functional block diagram of the detecting device in accordance with the present invention.

With reference to FIG. 2, the control circuit is composed of a central processor (10), a signal emitting/receiving unit (20), a door monitoring unit (30), a door control unit (40), a power supply unit (50) and a buzzer (60).

The central processor (10) is connected to and controls the signal emitting/receiving unit (20) to output detecting signals through the signal transceiver (1), wherein the reflected signals are also received by the signal emitting/receiving unit (20) and then passed to the processor (10). One output terminal of the central processor (10) is further connected to the buzzer (60) for generation of alarm sounds.

The door monitoring unit (30) with an output terminal connected to an input terminal of the central processor (10) to actuate the processor (10) when the door is opened.

The door control unit (40) responds to the control signals output from the central processor (10) to close/open the door.

The power supply unit (50) provides operating voltage to all units and elements of the detecting device.

After the door is opened, the door monitoring unit (30) immediately outputs a signal to actuate the central processor (10). After which, the central processor (10) drives the signal emitting/receiving unit (20) to output detecting signals. When the signals are reflected and received, the central processor (10) can determine whether any obstacle is near the door based on the time length of the emitted and reflected signals.

In the first embodiment of the present invention, the signal emitting/receiving unit (20) mentioned above is implemented by an infrared technique.

Figure 3A:
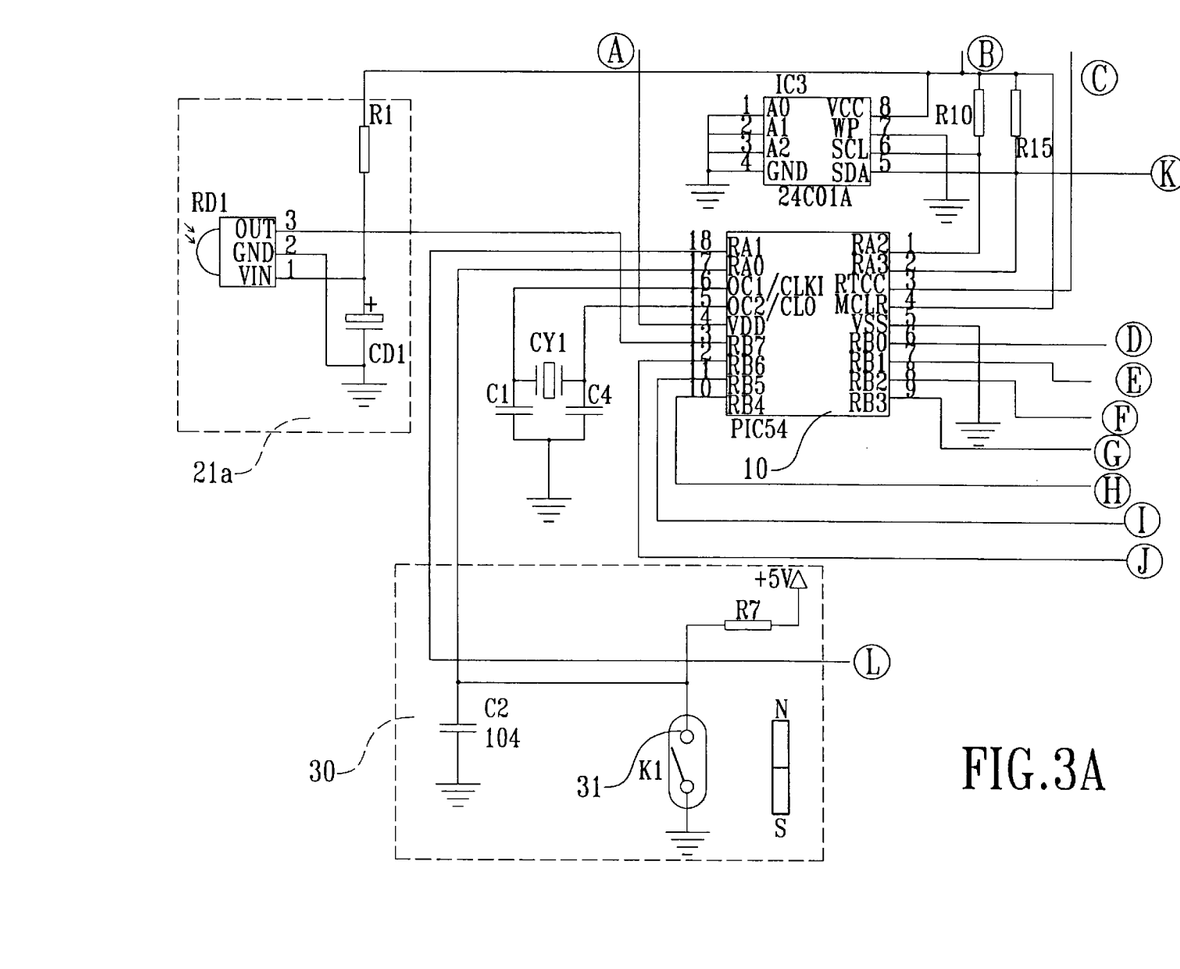
FIG. 3 is a circuit diagram of a first embodiment of the detecting device in accordance with the present invention.
Figure 3B:
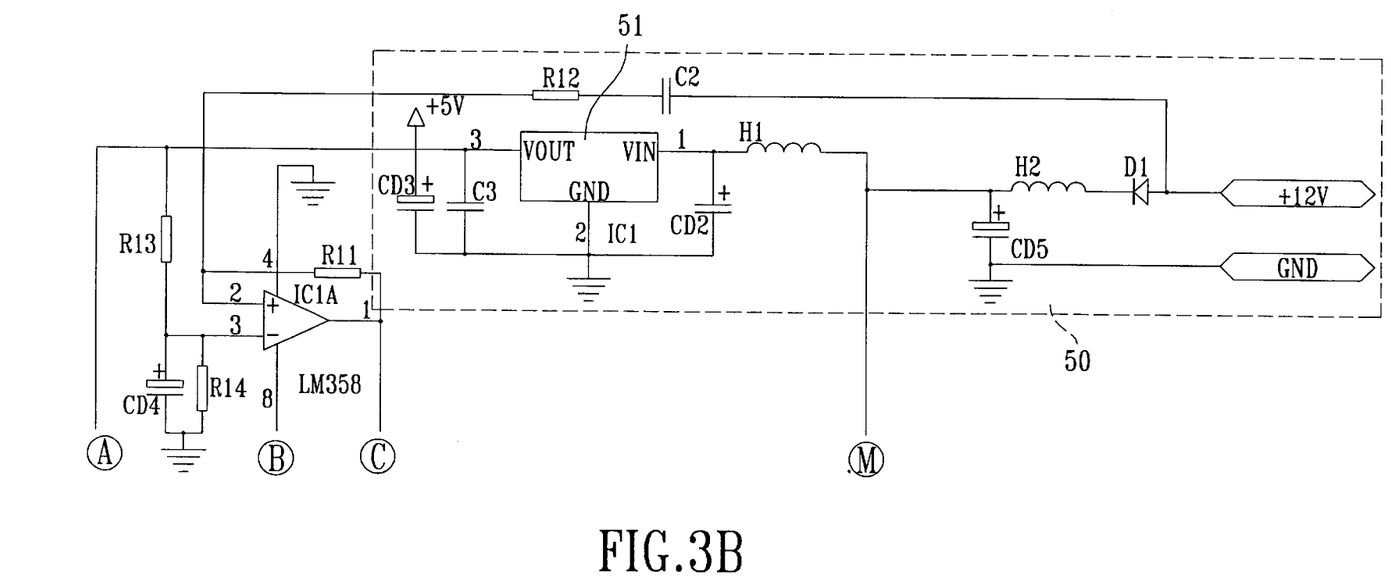
Figure 3C:
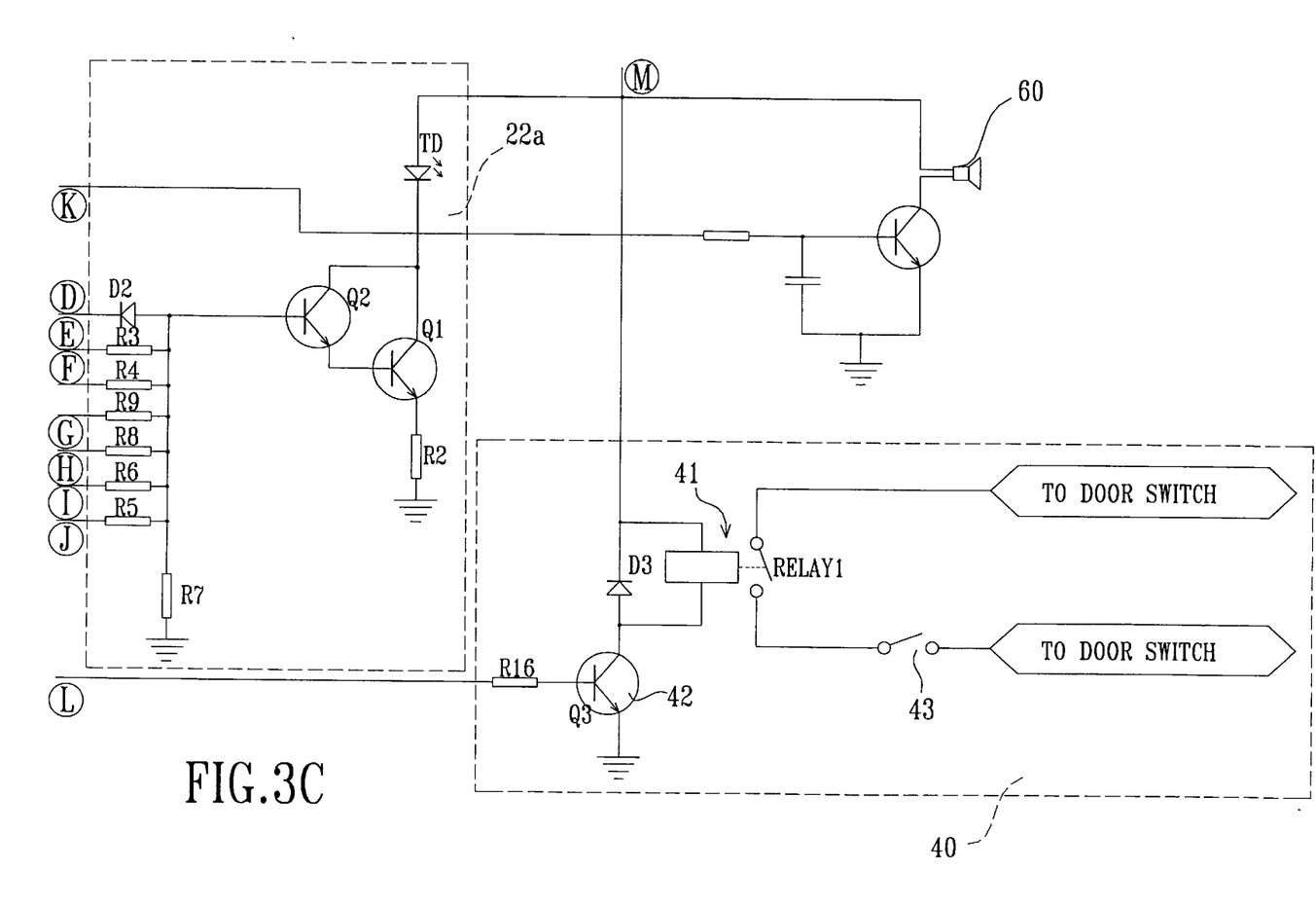

With reference to FIG. 3, the signal emitting/receiving unit (20) includes an infrared receiving unit (21a) connected to the input terminal of the central processor (10), and an infrared transmitting unit (22a) connected to output terminals of the central processor (10). The foregoing signal transceiver (1) equipped above the door is composed of an infrared receiver (RD1) and an infrared transmitter (TD1) in this embodiment.

The infrared receiving unit (21a) is mainly composed of the infrared receiver (RD1), a resistor and a capacitor. The infrared transmitting unit (22a) includes a diode (D2) having a negative terminal and a positive terminal, both terminals are respectively connected to the central processor (10) and a base terminal of a transistor (Q2). The transistor (Q2) in company with another transistor (Q1) are connected in the form of a Darlington pair. Both collector terminals of the transistors (Q1, Q2) are connected to a negative terminal of the infrared transmitter (TD1), wherein the positive terminal of the infrared transmitter (TD1) is connected to the power supply unit (50). Furthermore, several output terminals of the central processor (10) are connected to a converting circuit formed by resistors (R3–R9).

Still referring to FIG. 3, switch element (31) in response to the opening/closing actions of the door, such as a magnetic reed switch, is used as the main element of the door monitoring unit (30). One end of the switch element (31) is connected to a power terminal (5 volts) and the central processor (10); the other end of the switch element (31) is connected to ground.

The door control unit (40) mainly includes a relay (41) composed of a coil and a switch, a switching transistor (42) and a manual control switch (43). One end of the coil of the relay (41) is connected to the power supply unit (50), and the other end is connected to ground through the switching transistor (42). To close or open the switch of the relay (41) is determined by whether the coil is energized or not. The switch of the relay (41) is connected with a door switch (not shown). The manual control switch (43), connected to the switch of the relay (41) in series, is provided to directly and instantly control the closing/opening actions of the door in an emergency situation.

The power supply unit (50) utilizes a constant voltage IC (51) to provide a stable operating voltage, for example 5 volts, to the central processor (10).

After the door is opened, the switch element (31) is changed to an open status from its original closed status. Therefore, the central processor (10) detects the voltage level is from a low level changed to a high level, and thus immediately actuates the Darlington pair transistors (Q1, Q2) through the converting circuit (R3–R9) so that a current from the power supply unit (50) is able to flow through the infrared transmitter (TD1). When the current flows through the infrared transmitter (TD1), the infrared detecting signal is emitted.

When the detecting signal is reflected, the infrared receiver (RD1) receives the reflected signal and then transmits to the central processor (10). The central processor (10) instantly calculates a time interval T1, which starts from the time that the detecting signal is emitted and ends at the time that the reflected signal is received, and further compares with a default time interval T2. The setting of the default time interval T2 is obtained in such a condition that when there is no obstacle located under the signal transceiver (1), the time interval between the detecting signal being emitted and the reflected signal being received is calculated Obviously, the length of the default interval T2 is corresponded to the height of the vehicle door.

When there is any passenger or obstacle near the door, since the subject has a height, the emitted signal is early reflected from the top of the subject, and thus the measured time interval T1 is smaller than the default time interval T2 (T1<T2). When the central processor (10) detects that there is a subject near the door, the switching transistor (42) is not actuated so that the coil of the relay (41) has no energizing current flowing therethrough, whereby the switch of the relay is kept at open. Since the switch of the relay (41) is retained at open, there is no complete circuit loop for the door switch even when the door switch is carelessly pressed to close the vehicle door and so the vehicle door can not be closed.

Figure 4A:
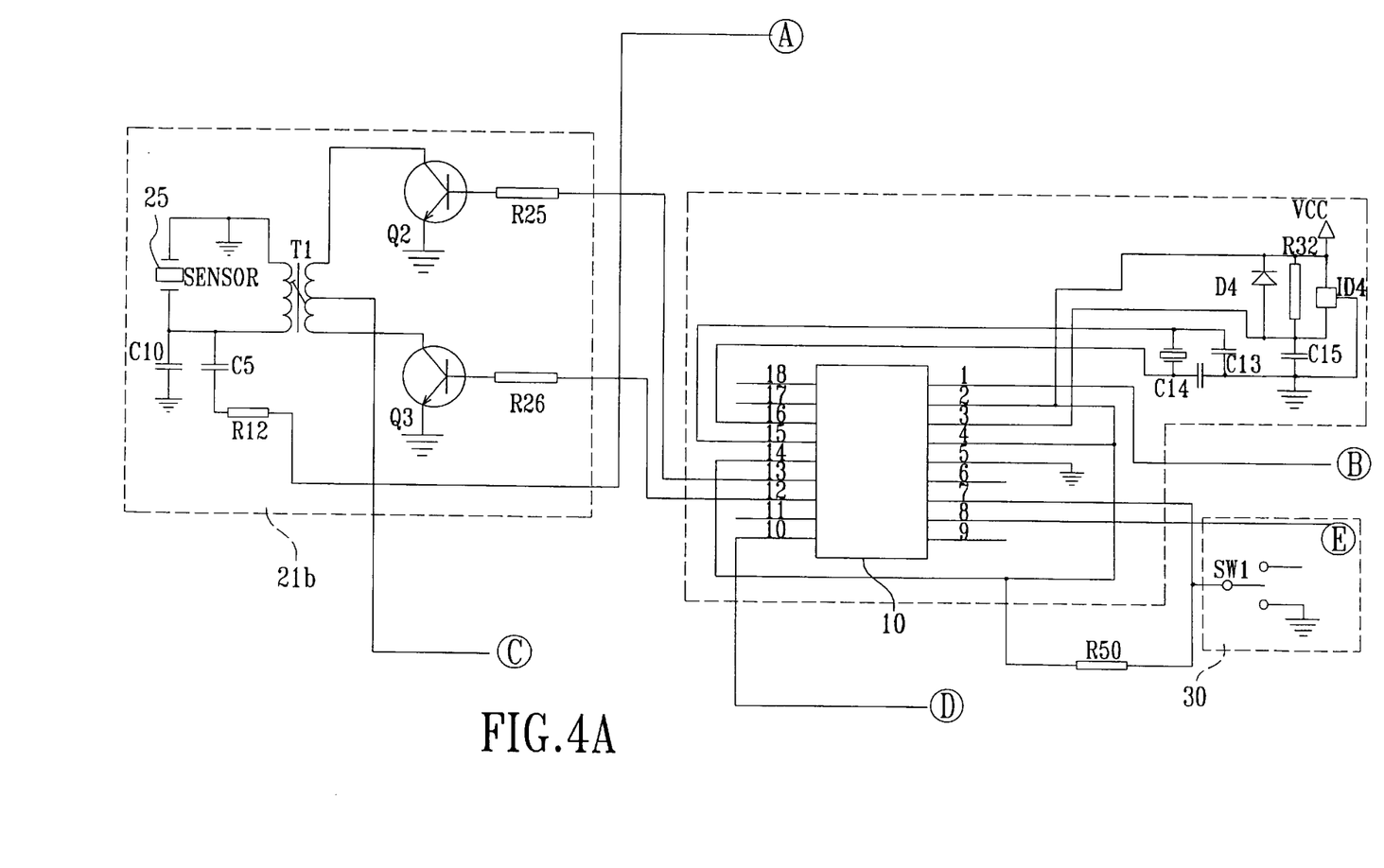
FIG. 4 is a circuit diagram of a second embodiment of the detecting device in accordance with the present invention.
Figure 4B:
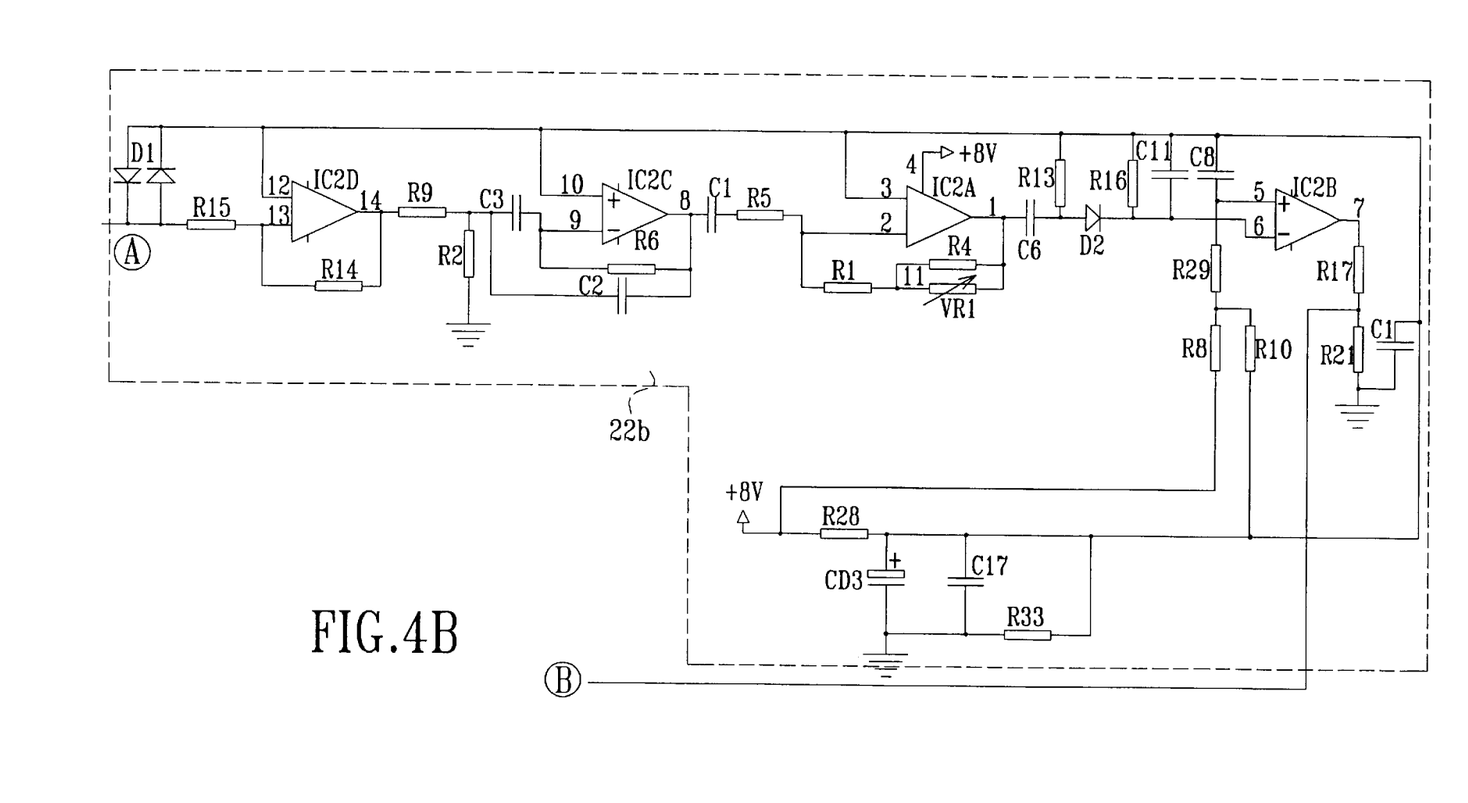
Figure 4C:
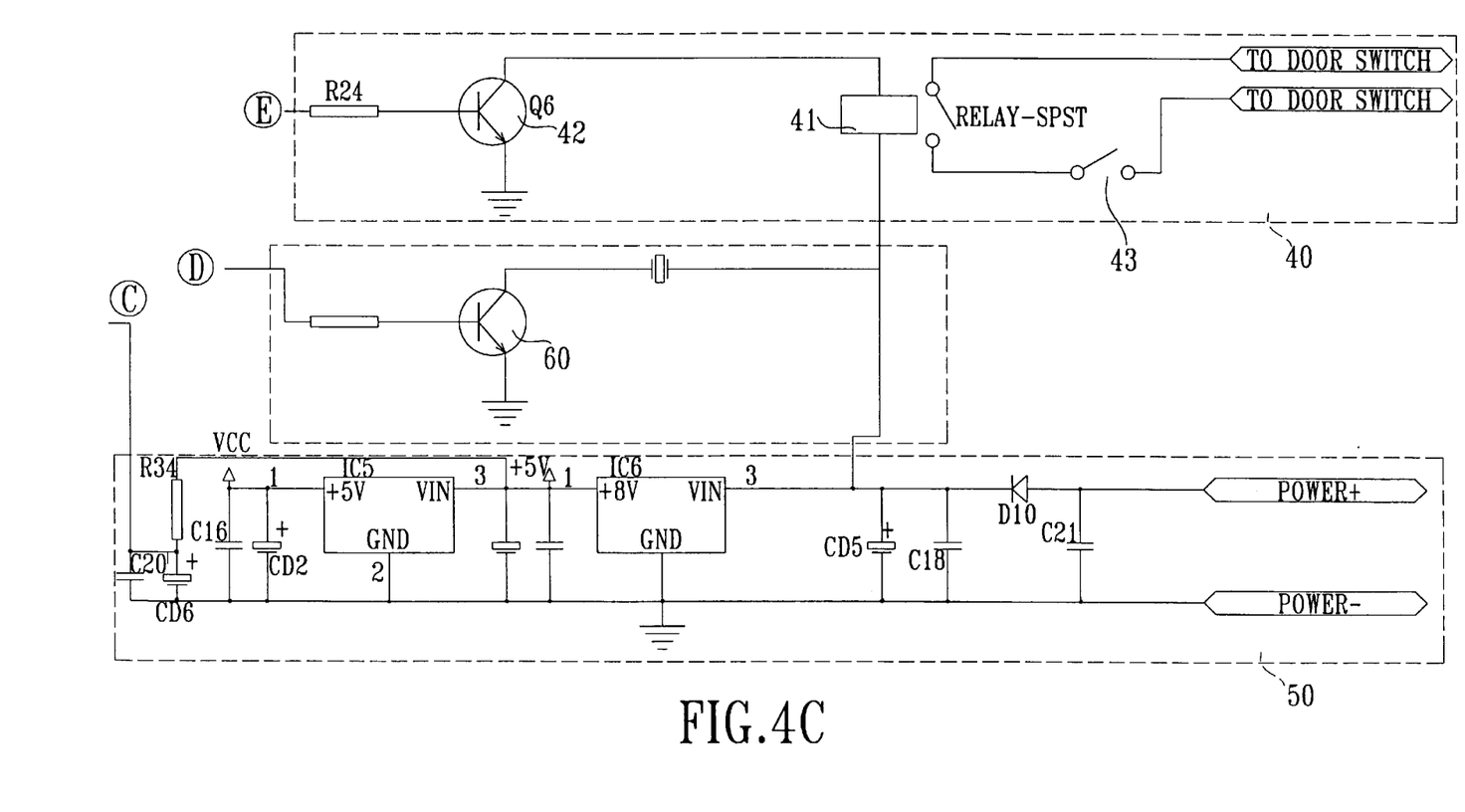

With reference to FIG. 4, the signal emitting/receiving unit (20) is implemented by ultrasonic technique in this embodiment, wherein the door monitoring unit (30), the door control unit (40) and the power supply unit (50) are substantially the same as the first embodiment discussed foregoing and their descriptions are accordingly omitted hereinafter. The change in the second embodiment is that the signal emitting/receiving unit (20) is composed of an ultrasonic emitting/receiving unit (21b) and a signal amplifying unit (22b), wherein the signal transceiver (1) equipped above the door is an ultrasonic transceiver (25).

The ultrasonic emitting/receiving unit (21b) further includes a transformer with a primary side and a secondary side, wherein the primary side is coupled to the ultrasonic transceiver (25), and the secondary side is coupled to the central processor (10) through two transistors (Q2, Q3). The output terminal of the ultrasonic transceiver (25) is further connected to an input terminal of the central processor (10) through the signal amplifying unit (22b).

When the central processor (10) detects that the door is opened by the door monitoring unit (30), the two transistors (Q2, Q3) are actuated and thus the secondary side of the transformer generates an induced current to drive the ultrasonic transceiver (25) to emit detecting signals. The reflected signals are amplified by the signal amplifying unit (22b) and then transmitted to the central processor (10).

The central processor (10) also calculates a time interval T1 based on the emitted ultrasonic signal and the reflected signal. The calculated time interval T1 is further compared with a default time interval T2 to judge if any subject is near the door. The operation of the central processor (10) in this embodiment is omitted because the operation is substantially the same as the first embodiment described foregoing.

From the foregoing description, whether the infrared technique or the ultrasonic technique, once the control circuit detects that the subject is near the door, the door is forced to remain open until the subject is removed. Therefore, the possible injuries to passengers caused from the door can be effectively avoided.

The foregoing description of the preferred embodiments of the present invention is intended to be illustrative only and, under no circumstances, should the scope of the present invention be restricted by the description of the specific embodiment.

What is claimed is:

1. A detecting device applied to a vehicle door, the detecting device comprising a signal transceiver placed above the vehicle door and connecting to a control circuit, wherein the control circuit further comprises:

a central processor controlling a signal emitting/receiving unit to output detecting signals and to receive reflected signals via the signal transceiver;

a door monitoring unit connected to the central processor for actuating the central processor when the door is opened;

a door control unit in response to the central processor to open or close the vehicle door; and a power supply unit providing operating voltage to the central processor, the door monitoring unit and the door control unit;

wherein after the vehicle door is opened, the central processor is actuated by the door monitoring unit and controls the signal emitting/receiving unit to output detecting signals via the signal transceiver, and then based on the reflected signals determines whether the door is able to be closed, wherein the signal transceiver is composed of an infrared transmitter and an infrared receiver, wherein the signal emitting/receiving unit comprises:

an infrared receiving unit that includes the infrared receiver connected to the central processor;

an infrared transmitting unit comprising:
- a diode with a negative terminal and a positive terminal respectively connected to the central processor and a Darlington pair transistors that is composed of two transistors;
- the infrared transmitter with a negative terminal and a positive terminal respectively connected to the Darlington pair transistors and the power supply unit; and
- a converting circuit composed of multiple resistors, wherein each resistor is connected to the positive terminal of the diode.

2. The detecting device as claimed in claim 1, wherein the door monitoring unit is composed of a switch element with two ends, wherein one end is connected to a power terminal and the central processor, and the other end of the switch element is connected to ground.

3. The detecting device as claimed in claim 1, wherein the door control unit is composed of a relay that has a coil and a switch, wherein the switch of the relay is adapted to connect to a door switch, wherein one end of the coil is connected to the power supply unit, and the other end of the coil is connected to ground through a switching transistor.

4. The detecting device as claimed in claim 1, wherein the power supply unit comprises a constant voltage IC to provide a stable operating voltage.

5. The detecting device as claimed in claim 1, wherein the central processor further connects to a buzzer.

6. The detecting device as claimed in claim 3, wherein the door control unit further has a manual control switch connected to the switch of the relay in series.

7. The detecting device as claimed in claim 2, wherein the door control unit is composed of a relay that has a coil and a switch, wherein the switch of the relay is adapted to connect to a door switch, wherein one end of the coil is connected to the power supply unit, and the other end of the coil is connected to ground through a switching transistor.

8. The detecting device as claimed in claim 7, wherein the power supply unit comprises a constant voltage IC to provide a stable operating voltage.

9. The detecting device as claimed in claim 8, wherein the door control unit further has a manual control switch connected to the switch of the relay in series.

10. The detecting device as claimed in claim 9, wherein the central processor further connects to a buzzer.

11. A detecting device applied to a vehicle door, the detecting device comprising a signal transceiver placed above the vehicle door and connecting to a control circuit, wherein the control circuit further comprises:

- a central processor controlling a signal emitting/receiving unit to output detecting signals and to receive reflected signals via the signal transceiver;
- a door monitoring unit connected to the central processor for actuating the central processor when the door is opened;
- a door control unit in response to the central processor to open or close the vehicle door; and
- a power supply unit providing operating voltage to the central processor, the door monitoring unit and the door control unit;

wherein after the vehicle door is opened, the central processor is actuated by the door monitoring unit and controls the signal emitting/receiving unit to output detecting signals via the signal transceiver, and then based on the reflected signals determines whether the door is able to be closed, wherein the signal transceiver is an ultrasonic transceiver, wherein the signal emitting/receiving unit comprises an ultrasonic emitting/receiving unit and a signal amplifying unit, wherein the ultrasonic emitting/receiving unit further comprises:
- a transformer with a primary side and a secondary side, wherein the primary side is coupled to the ultrasonic transceiver, and the secondary side is coupled to the central processor through two transistors;
- wherein an output terminal of the ultrasonic transceiver is connected to the central processor through the signal amplifying unit.

12. The detecting device as claimed in claim 11, wherein the door monitoring unit is composed of a switch element with two ends, wherein one end is connected to a power terminal and the central processor, and the other end of the switch element is connected to ground.

13. The detecting device as claimed in claim 11, wherein the door control unit is composed of a relay that has a coil and a switch, wherein the switch of the relay is adapted to connect to a door switch, wherein one end of the coil is connected to the power supply unit, and the other end of the coil is connected to ground through a switching transistor.

14. The detecting device as claimed in claim 11, wherein the power supply unit comprises a constant voltage IC to provide a stable operating voltage.

15. The detecting device as claimed in claim 13, wherein the door control unit further has a manual control switch connected to the switch of the relay in series.

16. The detecting device as claimed in claim 11, wherein the central processor further connects to a buzzer.

17. The detecting device as claimed in claim 12, wherein the door control unit is composed of a relay that has a coil and a switch, wherein the switch of the relay is adapted to connect to a door switch, wherein one end of the coil is connected to the power supply unit, and the other end of the coil is connected to ground through a switching transistor.

18. The detecting device as claimed in claim 17, wherein the power supply unit comprises a constant voltage IC to provide a stable operating voltage.

19. The detecting device as claimed in claim 18, wherein the door control unit further has a manual control switch connected to the switch of the relay in series.

* * * * *